(12) United States Patent
Tsai et al.

(10) Patent No.: US 9,875,909 B1
(45) Date of Patent: Jan. 23, 2018

(54) METHOD FOR PLANARIZING MATERIAL LAYER

(71) Applicant: UNITED MICROELECTRONICS CORP., Hsin-Chu (TW)

(72) Inventors: Fu-Shou Tsai, Keelung (TW); Yu-Ting Li, Chiayi (TW); Li-Chieh Hsu, Taichung (TW); Yi-Liang Liu, Tainan (TW); Kun-Ju Li, Tainan (TW); Po-Cheng Huang, Kaohsiung (TW); Chien-Nan Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/220,365

(22) Filed: Jul. 26, 2016

(51) Int. Cl.
| | |
|---|---|
| H01L 21/321 | (2006.01) |
| H01L 21/308 | (2006.01) |
| H01L 21/027 | (2006.01) |
| H01L 21/3105 | (2006.01) |
| H01L 21/02 | (2006.01) |
| H01L 21/3065 | (2006.01) |
| H01L 21/302 | (2006.01) |
| H01L 21/306 | (2006.01) |

(52) U.S. Cl.
CPC ...... *H01L 21/3212* (2013.01); *H01L 21/0214* (2013.01); *H01L 21/0217* (2013.01); *H01L 21/0273* (2013.01); *H01L 21/02164* (2013.01); *H01L 21/302* (2013.01); *H01L 21/3065* (2013.01); *H01L 21/3081* (2013.01); *H01L 21/30625* (2013.01); *H01L 21/31056* (2013.01); *H01L 21/31058* (2013.01)

(58) Field of Classification Search
None
See application file for complete search history.

(56) References Cited

U.S. PATENT DOCUMENTS

| | | | |
|---|---|---|---|
| 9,236,446 B2 | 1/2016 | Liu | |
| 2014/0061861 A1* | 3/2014 | Moustakas | H01L 21/3065 257/615 |
| 2016/0351409 A1* | 12/2016 | Takahata | H01L 21/3086 |

* cited by examiner

Primary Examiner — Jiong-Ping Lu
(74) *Attorney, Agent, or Firm* — Winston Hsu

(57) ABSTRACT

A method for planarizing a silicon layer includes providing a silicon layer having at least one recess therein. Next, a photoresist layer is formed to cover the silicon layer and fill up the recess. Then, the photoresist layer is hardened. After that, part of the photoresist layer is removed by taking a top surface of the silicon layer as a stop layer. Finally the photoresist layer and the silicon layer are etched back simultaneously to remove the photoresist layer entirely.

18 Claims, 4 Drawing Sheets

METHOD FOR PLANARIZING MATERIAL LAYER

BACKGROUND OF THE INVENTION

1. Field of the Invention

The present invention relates to a method of planarizing a material layer, and more particularly to a method of planarizing a silicon layer.

2. Description of the Prior Art

In the formation of integrated circuit structures, material layers are patterned to form active devices such as transistors, and passive devices such as resistors. Both types of devices are formed by depositing material layers and etching the layers to form one patterned layer on top of the other. This can result in irregular or substantially nonplanar surface features, causing problems to subsequent overlying layers and devices.

Conventionally, the method of etching back a material layer (such as a silicon layer) with a non-planar or stepped surface is by etching the silicon layer directly without using other insulating materials for a stop layer. It is very difficult, however, to get a planar surface of the silicon layer simply by using such standard etching back techniques.

SUMMARY OF THE INVENTION

According to a first preferred embodiment of the present invention, a method for planarizing a silicon layer includes providing a silicon layer having at least one recess therein. Next, a photoresist layer is formed to cover the silicon layer and fill up the recess. Then, the photoresist layer is hardened. After that, the photoresist layer is planarized by taking a top surface of the silicon layer as a stop layer. Finally the photoresist layer and the silicon layer are etched back simultaneously to remove the photoresist layer entirely.

According to a second preferred embodiment of the present invention, a method for planarizing a material layer includes providing a material layer having at least one recess therein. Then, a photoresist layer is formed to cover the material layer and fill up the recess. Next, the photoresist layer is hardened. Later, part of the photoresist layer is removed by taking a top surface of the material layer as a stop layer. Finally, the photoresist layer and the material layer are etched back simultaneously to remove the photoresist layer entirely.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depicts a method for planarizing a material layer according to a preferred embodiment of the present invention, wherein:

FIG. 2 is a fabricating stage following FIG. 1;
FIG. 3 is a fabricating stage following FIG. 2;
FIG. 5 is a fabricating stage following FIG. 4B;
and
FIG. 6 is a fabricating stage following FIG. 5.

DETAILED DESCRIPTION

Figure 1:
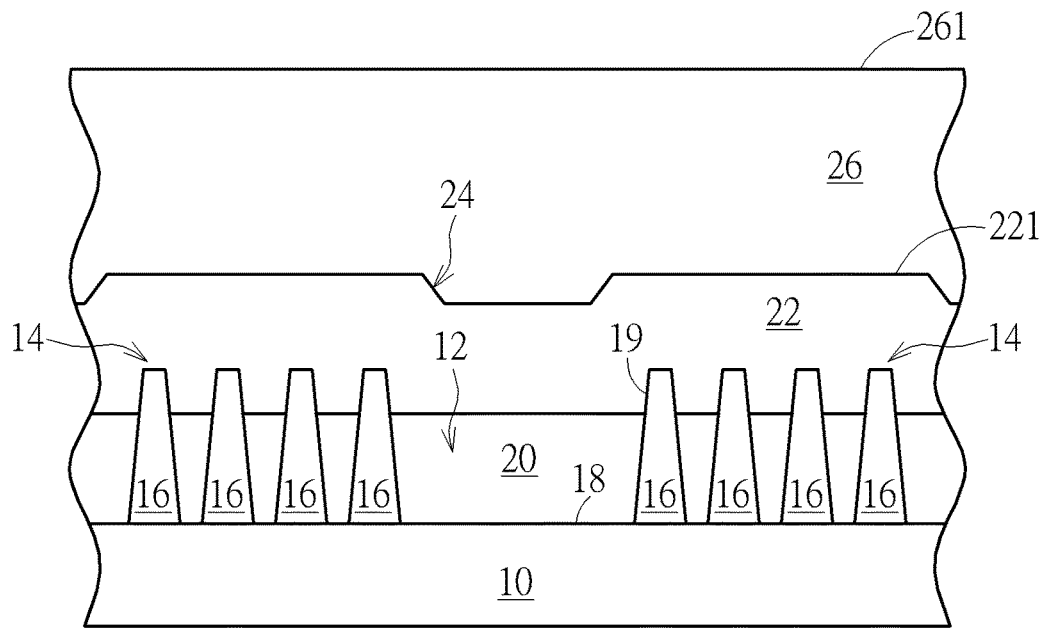

FIG. 1 to FIG. 6 depicts a method for planarizing a material layer according to a preferred embodiment of the present invention. As shown in FIG. 1, a substrate 10 is provided. The substrate 10 includes an isolated pattern 12 and a dense pattern 14. The dense pattern 14 preferably includes numerous fins 16. The isolated pattern 12 has a lower pattern density than that of the dense pattern 14. For example, the isolated pattern 12 may include a flat surface 18. The flat surface 18 may connect to the fins 16, and the flat surface 18 and the fins 16 define a trench 19. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A shallow trench isolation 20 is disposed between the fins 16. The shallow trench isolation 20 is also filled into the trench 19.

Later, a material layer 22 is conformally formed on the substrate 10 and the shallow trench isolation 20. The material layer 22 may be formed by a deposition process such as a chemical vapor deposition or a physical vapor deposition. Next, a mechanical scrub cleaning is performed to clean a top surface 221 of the material layer 22. The material layer 22 may be a semiconductor layer, a metal layer, or a dielectric layer. In detail, the material layer 22 may be made of silicon, germanium, silicon germanium, copper, tungsten, titanium, silicon nitride, silicon oxide or silicon oxynitride. According to a preferred embodiment of the present invention, the material layer 22 is a silicon layer such as an amorphous silicon layer. In this case, the thickness of the material layer 22 is between 1500 angstroms to 2000 angstroms, preferably about 1700 angstroms.

Because the substrate 10 has patterns with different density and the material layer 22 conformally covers the substrate 10, the top surface 221 of the material layer 22 forms a stepped surface. In detail, the top surface 221 of the material layer 22 directly above the dense pattern 14 is higher than the top surface 221 of the material layer 22 directly above the isolated pattern 12. In this embodiment, there is a recess 24 formed by the material layer 22. The recess 24 is directly above the trench 19.

Next, a photoresist layer 26 is formed to cover the material layer 22 and fill up the recess 24. It is noteworthy that an entire top surface 261 of the photoresist layer 26 is planar, meaning there is no height difference in the top surface 261 of the photoresist layer 26. The photoresist layer 26 is preferably formed by a spin-coating process. Then, the photoresist layer 26 is hardened by hard baking or deep ultraviolet light to cross-link the photoresist polymer.

Figure 2:
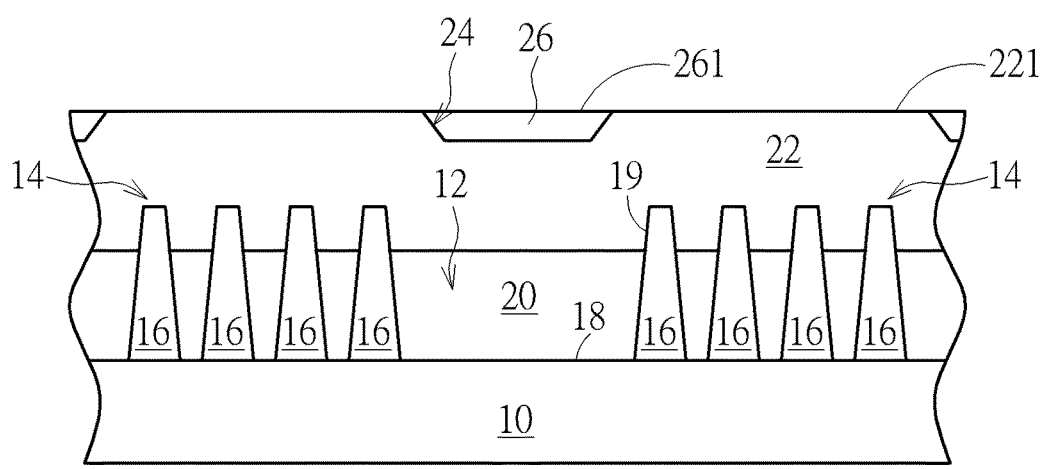

As shown in FIG. 2, part of the photoresist layer 26 is removed by taking the top surface 221 of the material layer 22 as a stop layer to align the top surface 221 of the material layer 22 with the top surface 261 of the remaining photoresist layer 26. It is noteworthy that the entire top surface 261 of the photoresist layer 26 is simultaneously removed vertically to a predetermined depth during the removing process. Moreover, the photoresist layer 26 does not have any pattern thereon during the stage of removing part of the photoresist layer 26.

The photoresist layer 26 can be removed by a chemical mechanical planarization process or an etching process such as a dry etching. Subsequently, a first clean process includes an SPM process and an SC1 process is optionally performed to clean the residuals on the photoresist layer 26 and the material layer 22. The solution used in the SPM process includes a mixture of sulfuric acid and hydrogen peroxide. The solution used in the SC1 process includes a mixture of deionized water, ammonium hydroxide and hydrogen peroxide.

Figure 3:
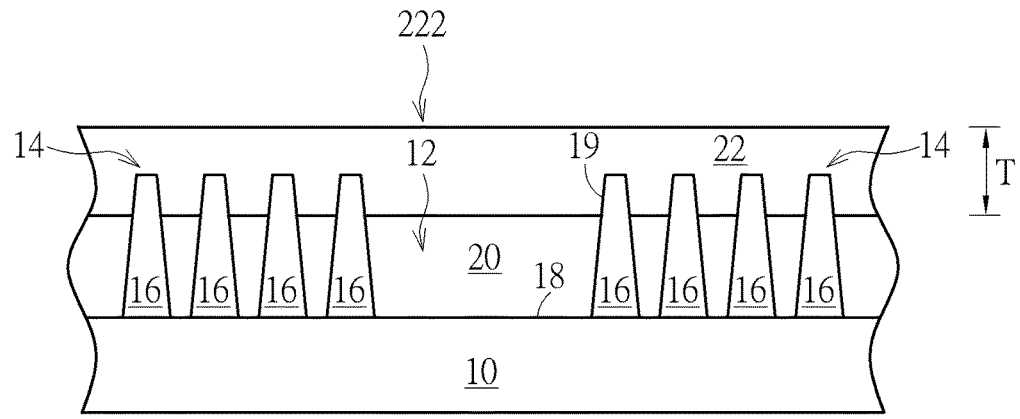

As shown in FIG. 3, the remaining photoresist layer 26 and the material layer 22 are etched back simultaneously until the photoresist layer 26 is removed entirely. After the photoresist layer 26 is entirely removed, the process continues to etch back the material layer 22 until the material layer 22 reaches a predetermined thickness T. The predetermined thickness T is between 1000 angstroms to 1500 angstroms, preferably about 1100 angstroms. When etching back the remaining photoresist layer 26 and the material layer 22, an etch rate of the photoresist layer 26 and an etch rate of the material layer 22 in the etchant are preferably the same. At this point, the material layer 22 is planarized and has a planar top surface 222. Next, a second clean process including an SPM process and an SC1 process is performed to clean the material layer.

Figure 4A:
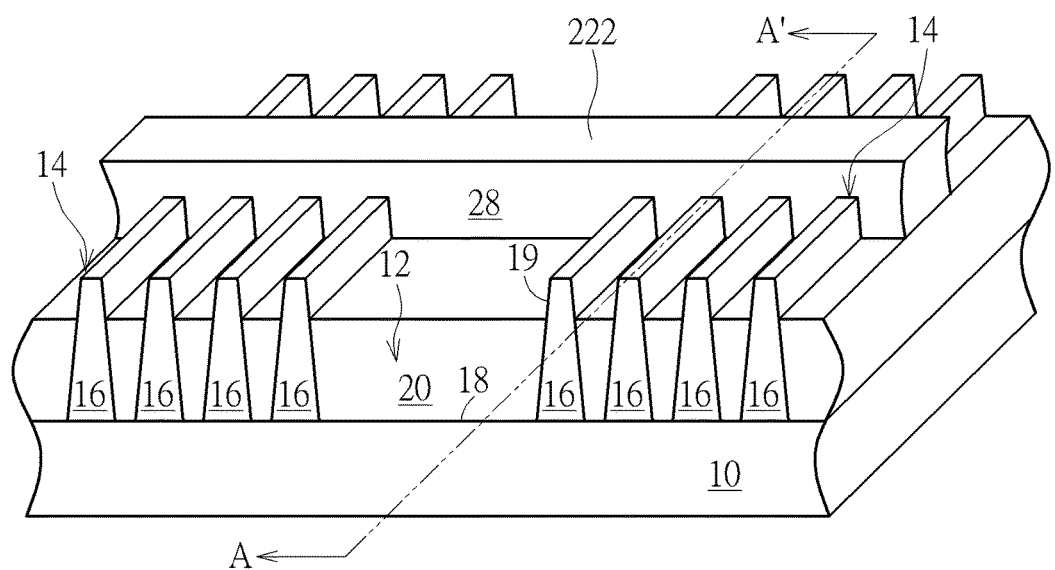
FIG. 4A shows a schematic three dimensional diagram of steps continuing from FIG. 3.
Figure 4B:
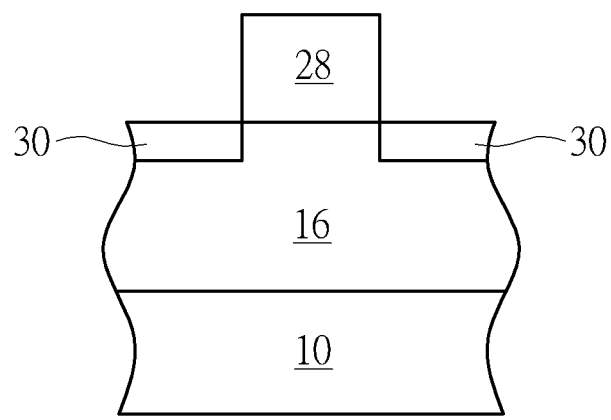
FIG. 4B is a sectional view taken along line AA' in FIG. 4A.

FIG. 4A shows a schematic three dimensional diagram of steps continuing from FIG. 3. FIG. 4B is a sectional view taken along line AA' in FIG. 4A. As shown in FIGS. 4A and 4B, the material layer 22 is patterned to form at least one gate 28. Then, source/drain doping regions 30 are formed in the fins 16 at two sides of the gate 28. The gate 28 may serve as a dummy gate or a gate for a FinFET. If the gate 28 serves as a gate for FinFET, a gate dielectric layer (not shown) should be formed on the fins 16 before the material layer 22 is formed.

Figure 5:
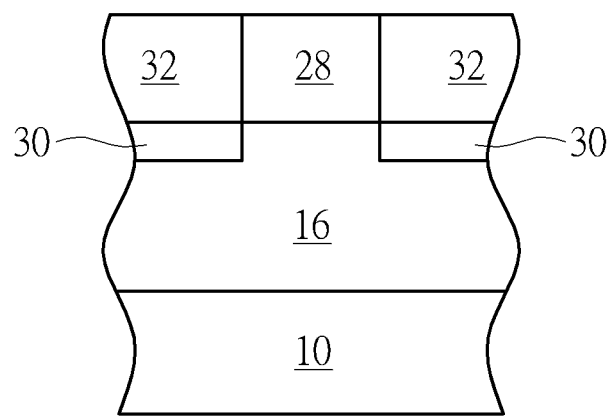
Figure 6:
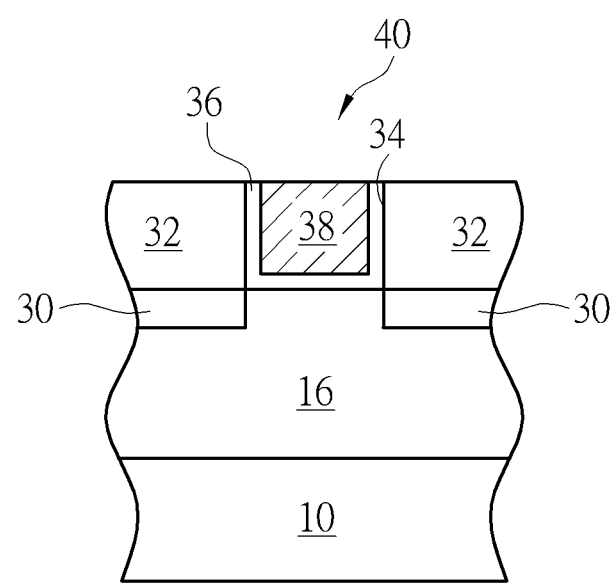

If the gate 28 serves as a dummy gate, the following steps to replace the dummy gate with a metal gate should be performed as shown in FIG. 5. A dielectric layer 32 is formed to cover the gate 28. Later, the dielectric layer 32 is planarized by taking the gate 28 as a stop layer. As shown in FIG. 6, the gate 28 is removed and a recess 34 in the dielectric layer 32 is formed. Later, a gate dielectric layer 36 is formed in the recess 34 followed by forming a metal gate 38 in the recess 34. The gate dielectric layer 36 may be a high-K material. As this point, a FinFet 40 is completed. In this embodiment, a high-K last process is illustrated. In other embodiments, a high-K first process can also be applied to the present invention.

The present invention utilizes the photoresist layer to fill up the recess formed by the material layer. By doing so, the top surface of the material layer and the top surface of the photoresist layer are aligned. In other words, the top surface of the material layer and the top surface of the photoresist layer together form a planar top surface. Then, an etching back process can be performed on the planar top surface. A material layer with a planar top surface can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for planarizing a silicon layer, comprising:
   providing a silicon layer having at least one recess therein;
   forming a photoresist layer covering the silicon layer and filling up the recess;
   hardening the photoresist layer;
   planarizing of the photoresist layer by taking a top surface of the silicon layer as a stop layer, wherein the step of planarizing the photoresist layer comprises planarizing the photoresist layer by a chemical mechanical planarization process; and
   etching back the photoresist layer and the silicon layer to remove the photoresist layer entirely.

2. The method for planarizing a silicon layer of claim 1, further comprising:
   providing a substrate covered by the silicon layer, wherein the substrate comprises an isolated pattern and a dense pattern, and the recess is directly above the isolated pattern.

3. The method for planarizing a silicon layer of claim 2, wherein the dense pattern comprises a plurality of fins, and the isolated pattern comprises a flat surface.

4. The method for planarizing a silicon layer of claim 1, wherein the step of planarizing the photoresist layer comprises planarizing the photoresist layer by an etching process.

5. The method for planarizing a silicon layer of claim 1, further comprising:
   after etching back the silicon layer, patterning the silicon layer to form at least one gate.

6. The method for planarizing a silicon layer of claim 1, wherein after forming the photoresist layer covering the silicon layer and before planarizing the photoresist layer, an entire top surface of the photoresist layer is flat.

7. The method for planarizing a silicon layer of claim 6, wherein the photoresist layer is formed by a spin-coating process.

8. The method for planarizing a silicon layer of claim 1, wherein after planarizing the photoresist layer by taking the top surface of the silicon layer as the stop layer, the top surface of the silicon layer is aligned with the top surface of the remaining photoresist layer.

9. A method for planarizing a material layer, comprising:
   providing a material layer having at least one recess therein;
   forming a photoresist layer covering the material layer and filling up the recess;
   hardening the photoresist layer;
   after hardening the photoresist layer, removing part of the photoresist layer by taking a top surface of the material layer as a stop layer, wherein the step of removing part of the photoresist layer comprises removing part of the photoresist layer by a chemical mechanical planarization process; and
   etching back the photoresist layer and the material layer to remove the photoresist layer entirely.

10. The method for planarizing a material layer of claim 9, wherein the material layer comprises a semiconductor layer, a metal layer, or a dielectric layer.

11. The method for planarizing a material layer of claim 9, wherein the material layer is copper, tungsten or titanium.

12. The method for planarizing a material layer of claim 9, wherein the material layer is silicon nitride, silicon oxide or silicon oxynitride.

13. The method for planarizing a material layer of claim 9, further comprising a substrate covered by the material layer, wherein the substrate comprises an isolated pattern and a dense pattern, and the recess is directly above the isolated pattern.

14. The method for planarizing a material layer of claim 13, wherein the dense pattern comprises a plurality of fins, and the isolated pattern comprises a flat surface.

15. The method for planarizing a material layer of claim 9, wherein the step of removing part of the photoresist layer comprises removing part of the photoresist layer by an etching process.

16. The method for planarizing a material layer of claim 9, wherein after forming the photoresist layer covering the material layer and before removing part of the photoresist layer, an entire top surface of the photoresist layer is flat.

17. The method for planarizing a material layer of claim 16, wherein the photoresist layer is formed by a spin-coating process.

18. The method for planarizing a material layer of claim 9, wherein after removing part of the photoresist layer by taking the top surface of the material layer as the stop layer, the top surface of the material layer is aligned with the top surface of the remaining photoresist layer.

* * * * *